United States Patent
Weitzel

[11] Patent Number: 6,147,889
[45] Date of Patent: Nov. 14, 2000

[54] DEVICE AND A METHOD FOR THE OPTICAL RECORDING, STORAGE AND READOUT OF INFORMATION

[75] Inventor: Thilo Weitzel, Tübingen, Germany

[73] Assignee: CAMPus Technologies AG, Zug, Switzerland

[21] Appl. No.: 09/232,894

[22] Filed: Jan. 15, 1999

[30] Foreign Application Priority Data

Jan. 16, 1998 [DE] Germany .......................... 198 01 470

[51] Int. Cl.[7] .................................................. G11C 11/42
[52] U.S. Cl. ............................................ 365/10; 365/215
[58] Field of Search ..................... 365/10, 215; 359/281, 359/287

[56] References Cited

U.S. PATENT DOCUMENTS

| | | | |
|---|---|---|---|
| 3,698,010 | 10/1972 | Lee ........................................... | 340/174 |
| 3,868,658 | 2/1975 | Kiemle ..................................... | 340/173 |
| 4,458,345 | 7/1984 | Bjorklund et al. ....................... | 369/103 |
| 4,937,786 | 6/1990 | Guruprasad ............................... | 365/10 |
| 5,119,328 | 6/1992 | Matsumoto et al. ...................... | 365/10 |
| 5,253,198 | 10/1993 | Birge et al. .............................. | 365/106 |
| 5,483,365 | 1/1996 | Pu et al. .................................... | 359/11 |
| 5,510,912 | 4/1996 | Blaum et al. .............................. | 359/21 |
| 5,665,493 | 9/1997 | Bai et al. ................................... | 430/1 |
| 5,777,760 | 7/1998 | Hays et al. ................................. | 359/7 |
| 5,808,779 | 9/1998 | Wels ......................................... | 359/290 |

FOREIGN PATENT DOCUMENTS

| | | |
|---|---|---|
| 97/02563 | 1/1997 | WIPO . |
| 97/43669 | 11/1997 | WIPO . |

*Primary Examiner*—Andrew Tran
*Assistant Examiner*—Anh Phung
*Attorney, Agent, or Firm*—Dilworth & Barrese

[57] ABSTRACT

A high memory capacity with relatively low demands on the optical quality of the components used is possible in accordance with the invention by the means to generate the at least two light rays and/or the memory element and/or means to guide the light rays are designed in such a way that the spatial orientation of the interference sample generated in the memory element by the light rays can be changed in any spatial direction over the spatial orientation of an interference pattern stored in the memory element and/or a light diffracting structure present in the memory element. The invention further relates to a device for the readout of optical information and a method for the optical recording and for the optical readout of information.

23 Claims, 3 Drawing Sheets

DEVICE AND A METHOD FOR THE OPTICAL RECORDING, STORAGE AND READOUT OF INFORMATION

BACKGROUND OF THE INVENTION

The present invention relates to a device for the optical recording, storage and readout of information with at least one memory element in which interference patterns can be stored and/or which possesses a light diffracting structure and/or in which a light diffracting structure can be generated, means to generate at least two light rays, with at least two of the light rays being able to be aligned in such a way that they can be combined in the memory element while forming an interference pattern, means for the frequency control or frequency shift and/or frequency modulation or for phase shift and/or phase modulation, by means of which at least one of the light rays guided to the memory element can be modulated, with at least one detector to detect the light rays and with at least one demodulator and/or with optical elements, by means of which a time and/or space modulation of the intensity with reference to the whole or parts of the detected ray cross-section can be measured.

The invention further relates to a device for the optical readout of information with at least one memory element in which interference patterns can be stored and/or which possesses a light diffracting structure and/or in which a light diffracting structure can be generated, means to generate at least one light ray on the memory element, with at least one other light ray being able to be generated with the memory element and with at least two light rays being able to be aligned in such a way that they can be combined while forming an interference pattern, means for frequency control and/or frequency shift and/or frequency modulation or for phase shift and/or phase modulation by means of which at least one of the combined light rays can be modulated, with at least one detector to detect the light rays and with at least one demodulator and/or with optical elements by means of which a time and/or space modulation of the intensity with reference to the whole or parts of the ray cross-section detected can be measured.

The invention further relates to the use of the device in accordance with the invention for the optical recording, storage and/or readout of information.

The invention further relates to a method for the optical recording of information in which in a memory element possessing a light diffracting structure and/or in which light diffracting structures can be generated, at least two light rays can be combined while forming an interference pattern for the purpose of the recording and a method for the optical display of information from a memory element possessing light diffraction structures in which memory element for the purpose of detecting a light diffracting structure at least two light rays are combined while forming an interference pattern with the frequency or the phase position of at least one of the light rays being varied/and or modulated over the others and with at least one of the light rays being emitted from the memory element and being detected by a detector and with a time or space modulation of this light ray being demodulated by means of a demodulator.

Optical memories are currently normally realized as page oriented holographic memories (POHM). Currently favored is a conventional optical array in a 90 degree geometry to record Fourier transform holograms and the angle multiplex method for the selection of the individual holograms. A pattern stored as a hologram at a certain angle represents one page, the individual picture elements of the pattern (pixels) represent the information stored on this page. The number of pages which can be stored in the angle multiplex process is limited by the angle resolution of the individual holograms and by the diffraction efficiency which decreases roughly inversely proportionally to the square of the number of holograms to be stored. The current developments therefore aim for the highest possible storage capacity per page.

FIG. 1 shows the principal design of a POHM. The beam splitter 10 splits an incident coherent light ray into a "reference" and an "object" ray. The reference ray can be switched by means of the shutter 12 and is guided to the memory element 30 via a mirror 20. The object ray can be switched by shutter 14 and is guided to a spatial light modulator (SLM) 40 via a mirror 22. The SLM 40 represents the information to be stored on one side, i.e. as an individual hologram, as a pattern of light and dark picture elements (pixels). This pattern is imaged by the lenses 50 and 52 through the memory element 30 true to size on a camera, normally a charge coupled device (CCD) 60. The pattern obtained at SLM 40 is thus restored by the CCD 60.

To record a page, the memory element 30 is turned to a suitable position, the information to be stored is presented at the SLM 40 and both shutters 12, 14 are opened for a suitable period (exposure time). The resulting interference pattern in the memory element 30 is stored as a hologram. Different holograms can be stored at different angle of rotation positions. To read a certain page, the memory element is turned into the angle of rotation position used in the recording and only shutter 12 is opened, i.e. the reference ray is applied. The pattern obtaining at the SLM 40 at the time of recording is then restored by the hologram and imaged on the CCD 60 where it can be accessed.

To improve the signal to noise ratio during the reading of the holograms, a heterodyne detection process for holographically optical memories has already been proposed. In this process, instead of the CCDs 60, a detector array has to be used whose single elements (pixels) react by means of suitable demodulators only to a time modulation of the intensity of the corresponding pixel. In the reading process, the image obtaining at the detector array is overlapped by an additional flat wave with a suitably different frequency over the reference ray. The resulting interference shows the required time modulation of the individual pixels.

With the generic optical memories, it is disadvantageous that the optimization of the memory capacity requires a substantial effort with regard to the quality of all optical components and of the memory medium due to an increase in the number of pages and in particular to the capacity per page. The number of pages which can be stored in the angle multiplex method is limited by the physical situation, heterodyne detection processes being unsuitable for a large number of pixels per page due to the technical effort to be effected. It is therefore the object of the present invention to provide a device and a method for the optical recording, storage and display of date in which a high memory capacity is possible with relatively low demands on the optical quality of the components used.

SUMMARY OF THE INVENTION

This object is solved in accordance with the invention by the means to generate the at least two light rays and/or the memory element and/or means to guide the light rays in a device for the optical recording, storage and display of information being designed in such a way that the spatial orientation of the interference pattern generated in the memory element by the light rays can be changed in any spatial direction over the spatial orientation of an interference pattern stored in the memory element and/or a light diffracting structure present in the memory element. In a device for the optical display of information, the object is solved in accordance with the invention by the means to generate the at least one light ray and/or the memory element and/or the means to guide the light rays being designed in such a way that the spatial angle between the combined rays can be changed in any spatial direction.

In this way, it is not the contents of a page or of a hologram which is read, but merely its presence (or absence) detected. The detection of the individual holograms is performed here by a heterodyne detection process in an array which can generally be considered as an interferometer. As the page information is dispensed with, the whole area of the ray cross-section can be used for the detection of a hologram. In devices in accordance with the invention that circumstance is explicitly used that in this procedure the detectable signal falls only roughly inversely proportionally to the number of holograms to be recorded, the angle resolution for the multiplexing is increased very highly over the conventional reading of holograms and that in particular, angle multiplexing is possible in all spatial directions. The advantages listed increase the number of holograms which can be stored in such a way that the omission of the page information over the conventional array is compensated for.

It is particularly advantageous if a hologram, in particular a multiplex hologram, can be recorded in the memory element and/or if the memory element comprises a hologram, in particular a multiplex hologram. It is equally possible to use corresponding optical elements not manufactured in a holographic manner such as, for example, structures of several thin films (dielectric mirrors), other periodic structures or even optical grating structures of computer generated holograms.

In accordance with a preferred embodiment of the present invention, the memory element can be turned through at least one axis.

In another embodiment of the present invention, the means to generate the light rays and/or the memory element and/or means to guide the light rays are designed in such a way that the angles of incidence of at least one of the light rays incident to the memory element can be changed in more than one plane.

The angle between the rays combined to interference in the memory element can be changeable.

Is it particularly advantageous if the wavelength can be changed by the means to generate the light rays.

In accordance with a preferred embodiment of the present invention, the memory element and/or the means to guide the light rays and/or additional elements are designed in such a way that the ray direction of at least one of the light rays can be changed in dependence on the wavelength.

In another embodiment of the present invention, means are provided to change the ray cross-section of at least one of the light rays. Furthermore, means can be provided for the spectral filtration or spatial modulation of phase and/or amplitude of at least one of the light rays.

It is particularly advantageous if means are provided for the manipulation of the partial rays or of the memory element which are designed in such a way that spatially separate partial regions of the memory element can be written or read independently of each other. Generally, the possibility exists of splitting the memory element into several partial holograms distinguishable spatially and/or by spatial angles and/or by variation of the angle between the partial rays and/or by variation of the wave fronts, and or being able to write or read these partial holograms either simultaneously by correspondingly many modulators and detectors with demodulators or consecutively independent of one another. Generally, it is equally possible to work simultaneously or consecutively at different wavelengths, with both the wavelength selectivity of the hologram and any potential wavelength selectivity of the recording material being able to be used, or with a dispersing element imaging different wavelengths to different angle.

In another embodiment of the present invention, parts of the device are provided in multiple and/or handle several of the rays.

It is particularly advantageous if all or a part of the rays are guided wholly or partly through guide waves and/or if all or a part of the optical elements are realised by means of the integrated optical system.

Based on a generic method for the optical recording of information, the object of the invention is further solved by the spatial orientation of the interference pattern generated by the light rays being able to be changed in any spatial direction between two recordings over the spatial orientation of a stored interference pattern and/or a light diffracting structure. In a generic method for the optical display of information, the direction of propagation of at least one of the light rays contributing to the interference can be changed in any spatial direction over the spatial orientation of a light diffracting structure stored in the memory element to detect different light diffracting structures.

BRIEF DESCRIPTION OF THE DRAWINGS

Further advantages and details of the device in accordance with the invention are explained in greater detail below by means of an example embodiment shown in the drawing, in which

FIG. 4 shows the spatial and time modulation of the intensity at the site of a detector in which

FIG. 2 shows a possible principle design of the device in accordance with the invention. The incident coherent light ray passes through the shutter 16 and is split into two partial rays by the beam splitter 10. One partial ray is guided via the mirror 20 to the memory element 30, the other partial ray is guided to the memory element 30 via an optical element 24 which allows a phase modulation or a frequency shift. Unlike the known arrays, the memory element 30 is designed rotatably through two axes, which allows the setting of any spatial angles. The transmitted rays are detected by detectors 70, 70' which integrate the intensity over the whole ray cross-section. The demodulator 80 detects a time modulation of the intensities detected by the detectors 70, 70'. The control of the modulation by the optical element 24 is effected by the modulator control 90.

FIG. 3 shows a detailed presentation of an advantageous embodiment of the memory element 30 as a rotatable cylinder 32 in a top view (top) and in a side view (bottom).

Figure 1:
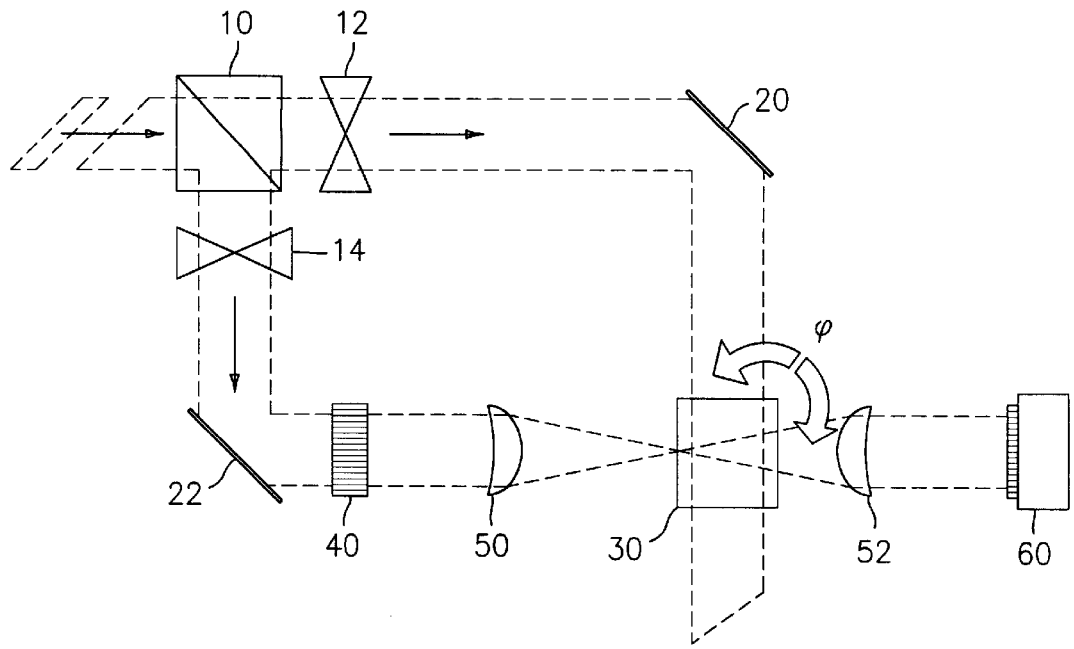
FIG. 1 shows the principal design of a page oriented holographic memory (POHM)
Figure 2:
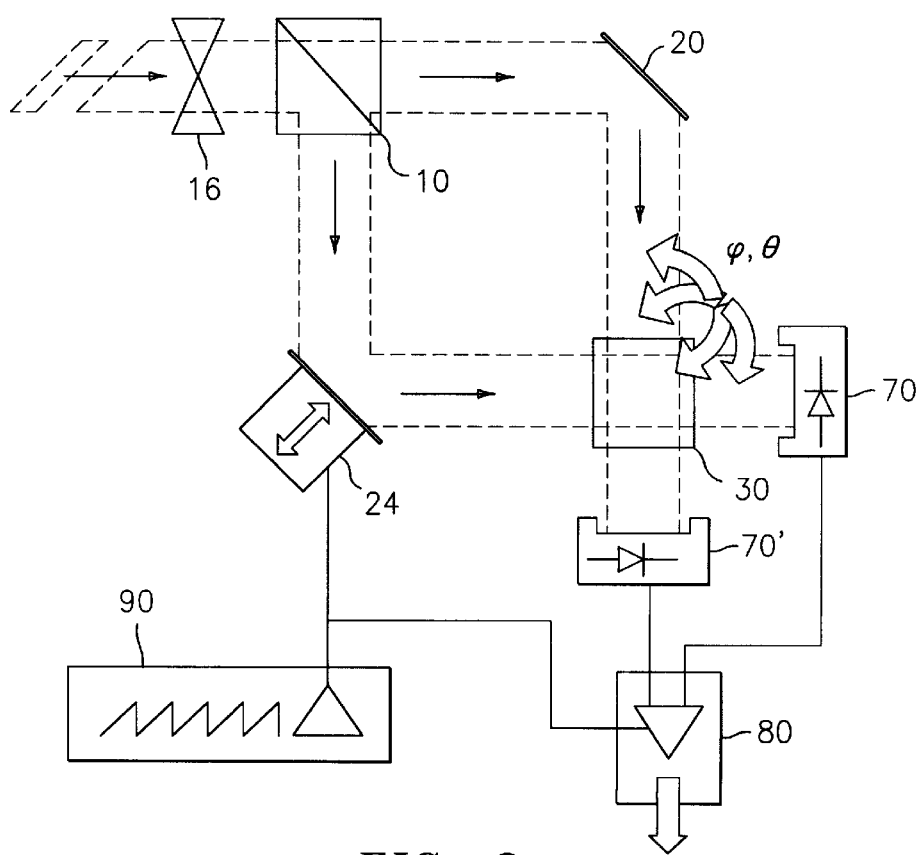
FIG. 2 shows a principle design of a device in accordance with the invention for the optical recording, storage and display of information.
Figure 3:
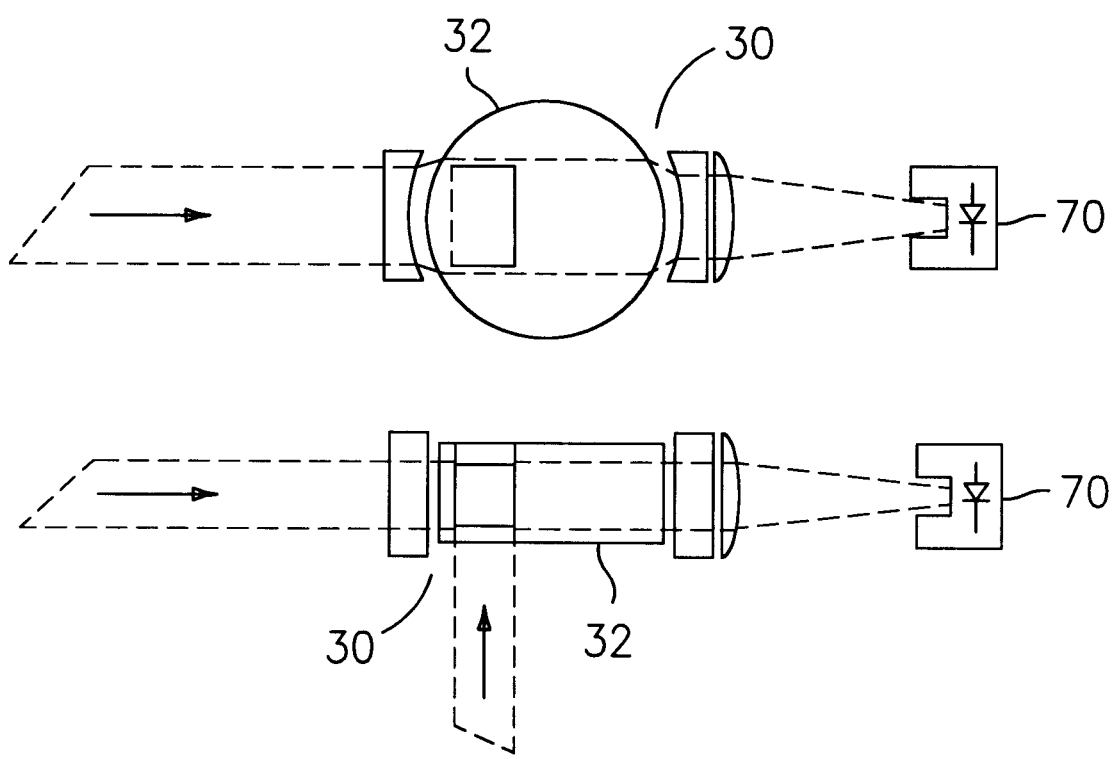
FIG. 3 shows an aspect of the memory element as a rotatable cylinder.

The radially guided ray can be modulated and is guided further onto the detector 70. One coordinate of the spatial angle is shown by rotation of the cylinder 32, the second coordinate of the spatial angle is realized by suitable deflection of the axially guided ray.

To record a hologram, the memory element 30 is brought into a suitable spatial angle position, the phase modulator or frequency shifter of the optical element 24 is not activated and the shutter 16 is opened for a suitable exposure period. The stationary interference pattern resulting in the memory element 30 is thus stored as a hologram. Holograms can be stored independently of one another at different spatial angle positions.

To detect a certain hologram, the memory element 30 is brought into the corresponding spatial angle position, the phase modulator or frequency shifter of the optical element 24 is activated and the shutter 16 is opened. The overlapping of the portions of the light rays transmitted and diffracted by the memory element 30 obtained at the detectors 70, 70' shows a characteristic time modulation of the amplitude which can be detected by the demodulator 80.

The time modulation detected in the array in accordance with the invention can be seen as the result of the interaction of the migrating interference pattern used for reading with the stationary interference pattern previously stored under the same conditions. The modulation only occurs when the two patterns are adjusted to true size in the whole volume detected. This explains the high spatial angle resolution of the array in all directions.

By way of illustration, FIG. 4 shows the spatial and time modulation of the intensity at the site of one of the detectors resulting for an array with flat waves in the detection of a hologram.

If the spatial orientation of the memory element 30 is only very slightly different to the spatial orientation in the recording of the hologram to be detected, the period of the spatial modulation of the interference pattern obtaining at the detector 70, 70' becomes very big. In particular, the spatial period of this interference pattern can become bigger than the ray cross-section detected by the detector 70, 70'. The FIGS. 4a) and 4b) show this situation for two times with a relative phase position of the partial rays different by π. The marked region at the center of the interference pattern shown represents the range of the rays detected by the detector 70, 70'.

Figure 4A:
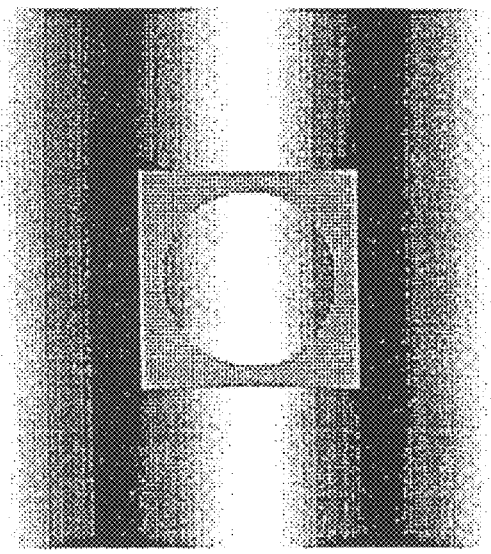
FIGS. 4a and 4b show differing spatial orientation of a memory element and FIGS. 4c and 4d show differing spatial orientation of a probe.
Figure 4B:
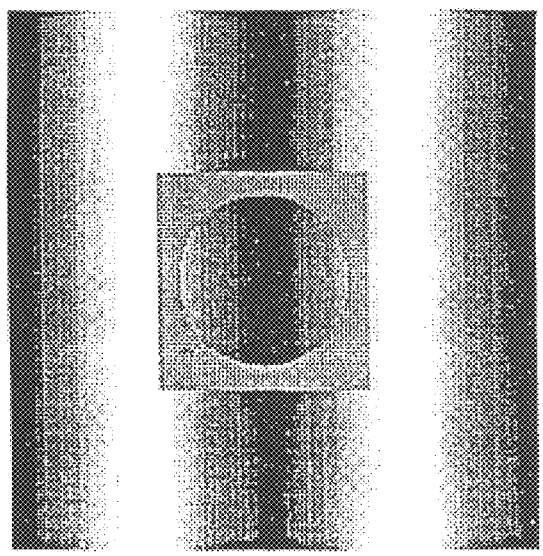
Figure 4C:
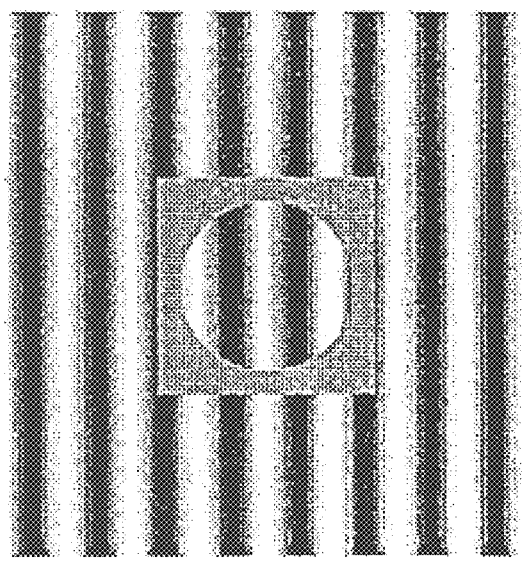
Figure 4D:
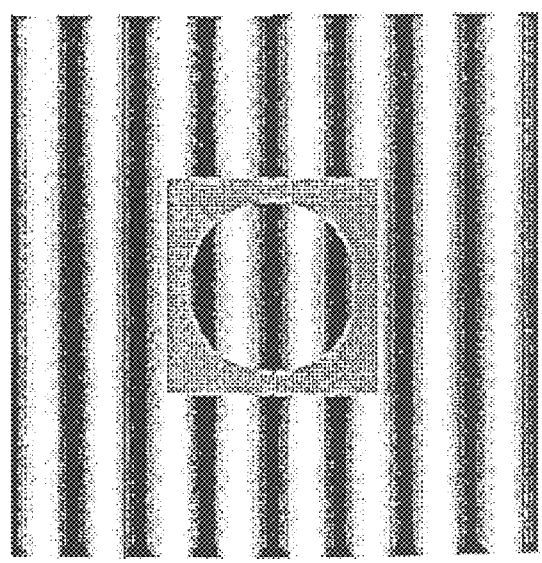

A change in the relative phase position of the partial rays leads to a lateral shift in the interference pattern. In this situation shown, this leads to a very strong modulation of the intensity integrated over the area detected. Even very small differences in the spatial orientation of the probe lead to a strong reduction in the period of the interference pattern in question. FIGS. 4c) and 4d) show such a situation for two periods with a relative phase position of the partial rays differing by π. The area detected by the detector 70, 70' overlaps several light and dark strips. As the number of strips increases, the modulation of the interference signal integrated over the whole area which can be measured during the lateral shift falls rapidly.

The ray path of the principle array shown for optical recording, storage and for the display of information corresponds to the ray path in a Mach-Zehnder interferometer. A corresponding array, in which the memory element and beam splitter are swapped over with respect to the array shown, can be used in accordance with the invention as a device only for the reading of stored information.

Instead of the means for the free adjustment of the spatial orientation of the memory element, means can be used which allow a corresponding change in the spatial angles of the light rays involved or of the other optical components. Furthermore, in particular with variations of the device in accordance with the invention suitable for reading only, the ray path of other interferometers can be used.

As well as or in addition to the spatial angle multiplexing described, further dimensions can be made usable with the aid of additional elements, for example multiplexing by variation of the wavefronts, spectral multiplexing or multiplexing by changing the spatial angle between the partial rays.

What is claimed is:

1. A device for the optical recording, storage and readout of information comprising at least one memory element (30) in which interference patterns can be stored and/or which possesses a light diffracting structure and/or in which a light diffracting structure can be generated;

means (10) for the generation of at least two light rays, with at least two of the light rays being able to be aligned in such a way that they can be combined in the memory element (30) while forming an interference pattern;

means for the frequency translation and/or frequency modulation or phase modulation (24) by means of which at least one of the light rays guided to the memory element (30) can be modulated:

at least one spacially integrating detector (70, 70') to detect the light rays;

and with at least one demodulator (80) and or with optical elements, by means of which a time and/or spatial modulation of the intensity with reference to the whole or parts of the ray cross-section detected can be measured, wherein the means (10) to generate the at least two light rays and/or the memory element (30) and/or means to guide the light rays (20, 24) are designed in such a way that the spatial orientation of the interference pattern generated by the light rays in the memory element (30) can be changed in any spatial direction over the spatial orientation of an interference pattern stored in the memory element (30) and/or a light diffracting structure present in the memory element (30).

2. A device for the optical readout of information comprising at least one memory element (30) in which interference patterns can be stored and/or which possesses a light diffracting structure and/or in which a light diffracting structure can be generated;

means for the generation of at least one light ray, with at least one light ray being able to be aligned to the memory element, with at least one further light ray being able to be generated with the memory element and with at least two light rays being able to be aligned in such a way that they can be combined while forming an interference pattern;

means for the frequency translation and/or frequency modulation or phase modulation, by means of which at least one of the combined light rays can be modulated;

at least one spacially integrating detector to detect the light rays;

and with at least one demodulator and/or with optical elements, by means of which a time and/or spatial modulation of the intensity with reference to the whole or parts of the ray cross-section detected can be measured, wherein
the means to generate the at least one light ray and/or the memory element and/or means to guide the light rays are designed in such a way that the spatial angle between the combined rays can be changed in any spatial direction.

3. A device in accordance with claim 1, wherein a hologram, in particular a multiplex hologram, can be recorded in the memory element (30) and/or the memory element (30) comprises a hologram, in particular a multiplex hologram.

4. A device in accordance with claim 1, wherein the memory element (30) can be rotated through at least one axis.

5. A device in accordance with claim 1, wherein the means (10) to generate the light rays and/or the memory element (30) and/or means to guide the light rays (20, 24) are designed in such a way that the angle of incidence of at least one of the light rays incident on the memory element (30) can be changed in more than one plane.

6. A device in accordance with claim 1, wherein the angle between the rays combined for interference in the memory element (30) can be changed.

7. A device in accordance with claim 1, wherein the wavelength can be changed by means of the means to generate the light rays (10).

8. A device in accordance with claim 1, wherein the memory element (30) and/or the means to guide the light rays (20, 24) and/or additional elements are designed in such a way that the ray direction of at least one of the light rays can be changed in dependence on the wavelength.

9. A device in accordance with claim 1, wherein means are provided to change the ray cross-section of at least one of the light rays.

10. A device in accordance with claim 1, wherein means for the spectral filtration and/or spatial modulation of phase and/or amplitude of at least one of the light rays are provided.

11. A device in accordance with claim 1, wherein means are provided for the manipulation of the partial rays or of the memory element (30) which are designed in such a way that spatially separate partial regions of the memory element (30) can be written or read independently of one another.

12. A device in accordance with claim 1, wherein parts of the device are provided in multiple and/or handle multiple rays.

13. A device in accordance with claim 1, wherein all or one part of the rays can be guided wholly or in part through wave guides and/or all or one part of the optical elements are realised by means of the integrated optical system.

14. The use of a device in accordance with claim 1 as a device for the optical recording, storage and/or display of information.

15. A method for the optical readout of information from a memory element (30) which possesses light diffracting structures, comprising steps of:
for the purpose of the detection of a light diffracting structure at least two light rays are combined while forming an interference pattern;
the frequency or relative phase position of at least one of the light rays is translated or modulated over the other and at least one of the light rays is emitted from the memory element (30) and is detected by a spacially integrating detector (70, 70');
and a time or spatial modulation of this light ray is demodulated by means of a demodulator (80), wherein
to detect different light diffraction structures, the direction of propagation of at least one of the light rays contributing to the interference can be changed in any spatial direction over the spatial orientation of a light diffracting structure stored in the memory element (30).

16. A device in accordance with claim 2, wherein a hologram, in particular a multiplex hologram, can be recorded in the memory element (30) and/or the memory element (30) comprises a hologram, in particular a multiplex hologram.

17. Device in accordance with claim 2, wherein the memory element (30) can be rotated through at least one axis.

18. A device in accordance with claim 2, wherein the means (10) to generate the light rays and/or the memory element (30) and/or means to guide the light rays (20, 24) are designed in such a way that the angle of incidence of at least one of the light rays incident on the memory element (30) can be changed in more than one plane.

19. A device in accordance with claim 2, wherein the angle between the rays combined for interference in the memory element (30) can be changed.

20. A device for the optical readout of information comprising
at least one memory element (30) in which interference patterns can be stored and/or which possesses a light diffracting structure and/or in which a light diffracting structure can be generated;
means for generating an interference pattern migrating with respect to a stored interference pattern;
means to adjust the two patterns to true size in the whole common volume;
and with at least one demodulator and/or with optical elements, by means of which a time and/or spatial modulation of the intensity with reference to the whole or parts of the ray cross-section detected can be measured,
wherein the means to adjust the two patterns are designed in such a way that the spatial orientation of the interference pattern generated by the light rays in the memory element (30) can be changed in any spatial direction over the spatial orientation of an interference pattern stored in the memory element (30) and/or light diffracting structure present in the memory element (30).

21. A method for the optical readout of information from a memory element (30) which possesses light diffracting structures, comprising steps of:
for the purposes of the detection of a light diffracting structure, at least two light rays are combined while forming an interference pattern migrating with respect to a light diffracting structure stored,
adjusting the two patterns to true size,
at least one of the light rays being emitted from the memory element and is detected by a spatially integrating detector,
a time or spatial modulation of the light ray is demodulated by means of a demodulator,
wherein to detect different light diffraction structures, the direction of propagation of at least one of the light rays contributing to the interference can be changed in any spatial direction over the spatial orientation of a light diffracting structure stored in the memory element.

22. Method according to claim 15 wherein instead of and/or in addition to an angular multiplexing, multiplexing by variation of wavefronts and/or spectral multiplexing and/or multiplexing by changing the angle between the partial rays is used.

23. Method according to claim 21 wherein instead of and/or in addition to an angular multiplexing, multiplexing by variation of wavefronts and/or spectral multiplexing and/or multiplexing by changing the angle between the partial rays is used.

\* \* \* \* \*